United States Patent
Lee

(10) Patent No.: US 9,825,099 B2
(45) Date of Patent: Nov. 21, 2017

(54) SWITCHING ELEMENT, SWITCHING ELEMENT ARRAY, AND RESISTIVE RANDOM ACCESS MEMORY INCLUDING SWITCHING ELEMENT, AND METHODS OF MANUFACTURING THE SAME

(71) Applicant: SK hynix Inc., Icheon (KR)

(72) Inventor: Jae Yeon Lee, Gunpo (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/231,686

(22) Filed: Aug. 8, 2016

(65) Prior Publication Data
US 2017/0256589 A1  Sep. 7, 2017

(30) Foreign Application Priority Data
Mar. 2, 2016  (KR) .................. 10-2016-0025230

(51) Int. Cl.
*H01L 45/00* (2006.01)
*H01L 27/24* (2006.01)

(52) U.S. Cl.
CPC ...... *H01L 27/2481* (2013.01); *H01L 45/1233* (2013.01); *H01L 45/1253* (2013.01); *H01L 45/146* (2013.01); *H01L 45/165* (2013.01)

(58) Field of Classification Search
CPC ............. H01L 27/2481; H01L 45/1233; H01L 45/1253; H01L 45/146; H01L 45/165

USPC .............................................. 257/4; 438/382
See application file for complete search history.

(56) References Cited

U.S. PATENT DOCUMENTS

| | | | |
|---|---|---|---|
| 2013/0048937 A1* | 2/2013 | Tong | H01L 45/04 257/2 |
| 2013/0313505 A1 | 11/2013 | Herner | |
| 2013/0341587 A1 | 12/2013 | Pellizzer et al. | |
| 2016/0248009 A1* | 8/2016 | Lee | H01L 45/1253 |

* cited by examiner

*Primary Examiner* — Cuong Q Nguyen
*Assistant Examiner* — Tong-Ho Kim

(57) ABSTRACT

A first electrode and an insulation material layer are sequentially formed over a substrate. A doping mask pattern is formed over the insulation material layer. The doping mask pattern exposes a portion of the insulation material layer. Dopants are injected into the exposed portion of the insulation material layer. The doping mask pattern is removed. A second electrode layer is formed over the insulation material layer. One or more pillar-shaped structures, each of which includes a second electrode, an insulation layer and a first electrode formed by respectively patterning the second electrode layer, the insulation material layer, and the first electrode layer. Each of the one or more pillar-shaped structures includes, in the insulation layer, a part of the exposed portion of the insulation material layer that is doped with the dopants. A threshold switching operation is performed in a region doped with the dopants of the insulation layer.

17 Claims, 33 Drawing Sheets

SWITCHING ELEMENT, SWITCHING ELEMENT ARRAY, AND RESISTIVE RANDOM ACCESS MEMORY INCLUDING SWITCHING ELEMENT, AND METHODS OF MANUFACTURING THE SAME

CROSS-REFERENCE TO RELATED APPLICATION

The present application claims priority under 35 U.S.C 119(a) to Korean Patent Application No. 10-2016-0025230, filed on Mar. 2, 2016, which is herein incorporated by reference in its entirety.

BACKGROUND

1. Technical Field

Various embodiments of the present disclosure generally relate to a switching element used in semiconductor devices and, more particularly, to a switching element, a switching element array, a resistive random access memory (ReRAM) device including the switching element, and methods of manufacturing the switching element, the switching element array, and the ReRAM device.

2. Related Art

A cross-point memory array structure has been employed in cell regions of highly integrated memory devices. More specifically, the cross-point memory array structure has been included in memory devices such as ReRAM devices, phase change random access memory (PCRAM) devices, and magnetic random access memory (MRAM) devices. The cross-point memory array structure may be a cell structure having a pillar interposed between electrodes that are disposed on different planes and that intersect with each other.

Meanwhile, in the cross-point memory array structure, there may be writing errors or reading errors on cell information due to an undesired sneak current that may be generated between adjacent cells. In order to prevent the write errors or the read errors from occurring due to the undesired sneak current, a selection element may be employed in each memory cell of memory devices. A switching element such as a transistor, a diode, a tunnel barrier device, or an ovonic threshold switch has been suggested as the selection element.

SUMMARY

Various embodiments are directed to a switching element having a pillar-shaped structure, a switching element array, a ReRAM device employing the switching element as a selection element of a memory cell, and methods of manufacturing the switching element, the switching element array, and the ReRAM device.

According to an embodiment, a method of manufacturing a switching element includes sequentially forming a first electrode layer and an insulation material layer over a substrate, forming a doping mask pattern over the insulation material layer, the doping mask pattern exposing a portion of the insulation material layer, injecting dopants into the exposed portion of the insulation material layer, removing the doping mask pattern, forming a second electrode layer over the insulation material layer, and forming one or more pillar-shaped structures, each of which includes a second electrode, an insulation layer, and a first electrode, by respectively patterning the second electrode layer, the insulation material layer, and the first electrode layer. Each of the one or more pillar-shaped structures includes, in the insulation layer, a part of the exposed portion of the insulation material layer that is doped with the dopants. A threshold switching operation is performed in a region of the insulation layer that is doped with the dopants.

According to an embodiment, a switching element array includes an array of pillar-shaped structures, each of the array of pillar-shaped structures including a first electrode, an insulation layer and a second electrode, and a threshold switching operation region disposed in the insulation material layer of each of the array of pillar-shaped structures. Each of the threshold switching operation regions extends from an outer peripheral surface of the respective pillar-shaped structures to an inside region of the respective pillar-shaped structure. Each of the threshold switching operation regions includes dopants that dope the insulation layer into an N-type region or a P-type region. Each of the threshold switching operation regions faces another threshold switching operation region of an adjacent pillar-shaped structure.

According to an embodiment, a method of manufacturing a resistive memory device includes forming a lower electrode layer, a resistive memory material layer, a middle electrode layer and an insulation material layer over a substrate, forming a doping mask pattern over the insulation material layer, portions of the insulation material layer being exposed by the doping mask pattern, the exposed portion overlapping a portion of a pillar-shaped structure forming region, injecting dopants into the exposed portions of the insulation material layer, removing the doping mask pattern, forming an upper electrode layer over the insulation material layer, and form a pillar-shaped structure including a lower electrode layer, a resistive memory layer, a middle electrode layer, an insulation layer and an upper electrode layer by patterning the upper electrode layer, the insulation material layer, the middle electrode layer, the resistive memory material layer, and the lower electrode layer. A threshold switching operation is performed in a doped region of the insulation layer.

According to an embodiment, resistive memory device includes an array of pillar-shaped structures, each of the array of pillar-shaped structures including a lower electrode, a resistive memory layer, a middle electrode, an insulation layer, and an upper electrode, and a threshold switching operation region formed in each of the array of pillar-shaped structures, each threshold switching operation region being disposed in at least a portion of the insulation layer, and extending from an outer peripheral surface of the pillar-shaped structure to an inside of the pillar-shaped structure. Each threshold switching operation region includes dopants that dope the insulation layer into an N-type region or a P-type region. Each threshold switching operation region covers a portion of the insulation layer when the insulation layer is cut off along a direction that is nonparallel to a height direction of the pillar-shaped structure. The threshold switching operation region faces another threshold switching operation region of the adjacent pillar-shaped structure.

BRIEF DESCRIPTION OF THE DRAWINGS

Various embodiments of the disclosure will become more apparent in view of the attached drawings and accompanying detailed description, in which.

DETAILED DESCRIPTION OF THE EMBODIMENTS

Figure 1:
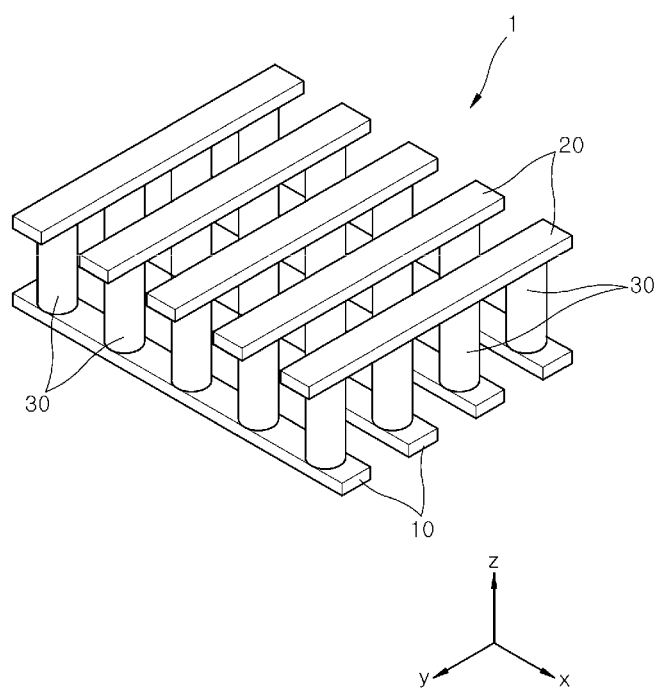
FIG. 1 is a perspective view illustrating a cross-point array device according to an embodiment.

Various embodiments will now be described more fully hereinafter with reference to the accompanying drawings. In the drawing figures, the dimensions of layers and regions may be exaggerated for clarity of illustration.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the element in the figures is turned over, elements described as "below" or "beneath" other elements or features would then be oriented "above" the other elements or features. Thus, the exemplary term "below" can encompass both an orientation of above and below. The element may be otherwise oriented (rotated 90 degrees or at other orientations) and the spatially relative descriptors used herein interpreted accordingly.

It will be understood that when an element is referred to as being "on," "above", "below," or "under" another element, it can be directly "on," "above", "below," or "under" the other element, respectively, or intervening elements may also be present. Like reference numerals refer to like elements throughout.

As used herein, the singular terms "a," "an," and "the" are intended to include the plural forms as well, unless the context clearly indicates otherwise. It will be further understood that the terms "comprise," "comprising," "includes," "including," "have," "having," and variants thereof specify the presence of stated features, integers, steps, operations, elements, and/or components, but do not preclude the presence and/or addition of one or more other features, integers, steps, operations, elements, components, and/or groups thereof.

According to the following embodiments, switching elements performing a threshold switching operation may be provided. The term "threshold switching operation" described herein means an operation in which the switching element is turned on or off while an external voltage is applied to the switching element. In such a case, an absolute value of the external voltage may gradually increase or decrease. When the absolute value of the external voltage applied to the switching element increases, the switching element may be turned on, thereby causing an operation current to nonlinearly increase when the absolute value of the external voltage is greater than a first threshold voltage. When the absolute value of the external voltage applied to the switching element is reduced after the switching element is turned on, the switching element may be turned off, thereby causing the operation current to nonlinearly decrease when the absolute value of the external voltage is less than a second threshold voltage. As such, the switching element performing the threshold switching operation may have a non-memory operation characteristic.

Figure 2:
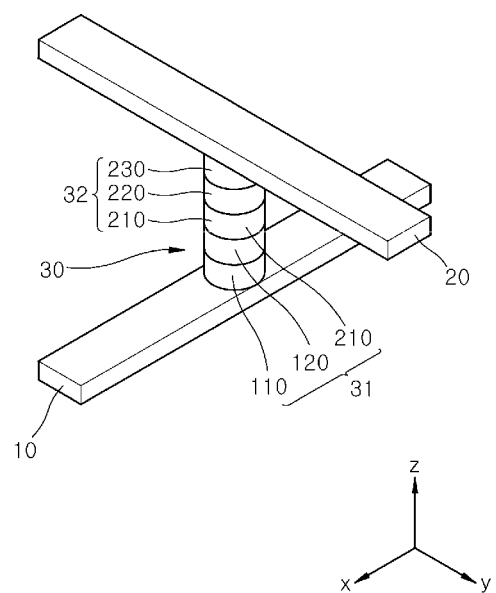
FIG. 2 is an enlarged view illustrating a portion of the cross-point array device illustrated in FIG. 1.

FIG. 1 is a perspective view illustrating a cross-point array device 1 according to an embodiment. FIG. 2 is an enlarged view illustrating a portion of the cross-point array device 1 illustrated in FIG. 1.

Referring to FIG. 1, the cross-point array device 1 may include first conductive lines 10 extending in an X-direction, second conductive lines 20 extending in a Y-direction and overlapping the first conductive lines 10, and pillar-shaped structures 30 disposed at overlap regions where the first conductive lines 10 and the second conductive lines 20 overlap and extending in a Z-direction. Although FIG. 1 illustrates an example in which a rectangular coordinate system of the X-direction, the Y-direction, and the Z-direction is used, the present disclosure is not limited to the rectangular coordinate system. In another embodiment, any one of various non-rectangular coordinate systems may be used to describe the cross-point array device 1. In such a case, the X-direction and the Y-direction may intersect each other at a non-right angle, and the Z-direction may be perpendicular to both of the X-direction and the Y-direction. The pillar-shaped structures 30 may constitute an array distributed along the X-direction and the Y-direction.

Referring to FIG. 2, each of the pillar-shaped structures 30 may include a variable resistive element 31 and a selection element 32. The variable resistive element 31 may include a lower electrode 110, a resistive memory layer 120, and a middle electrode 210. The selection element 32 may include the middle electrode 210, an insulation layer 220, and an upper electrode 230. The variable resistive element 31 may share the middle electrode 210 with the selection element 32. Accordingly, the cross-point array device 1 illustrated in FIGS. 1 and 2 may function as a memory cell array of a ReRAM device, the memory cell array including a plurality of memory cells, each of which is comprised of the variable resistive element 31 and the selection element 32.

The ReRAM device may be defined as a memory device that discriminates between electrical signals, stored in any one of the pillar-shaped structures 30 disposed between the first conductive lines 10 and the second conductive lines 20, based on an amount of current flowing through the selected pillar-shaped structure 30. In some embodiments, the ReRAM device may include an RRAM device, a PCRAM device, or an MRAM device. In such cases, the variable resistive element 31 may have a memory characteristic relating to an electrical resistance value of the variable resistive element 31. In contrast, the selection element 32 may have a non-memory characteristic that is due to a threshold switching operation.

In the variable resistive element 31, each of the lower electrode 110 and the middle electrode 210 may include a metal material, a conductive nitride material, or a conductive oxide material. In some embodiments, each of the lower electrode 110 and the middle electrode 210 may include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), or ruthenium oxide ($RuO_2$).

In the variable resistive element 31, the resistive memory layer 120 may include a material having a high resistive state or a low resistive state according to an externally applied voltage. In some embodiments, the resistive memory layer 120 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material.

In another embodiment, the resistive memory layer 120 may include a perovskite material such as a praseodymium calcium manganese oxide ($Pr_{0.7}Ca_{0.3}MnO_3$) material, a $La_{1-x}Ca_xMnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a $(Ba,Sr)TiO_3$(Cr,Nb-doped) material, a $SrZrO_3$(Cr,V-doped) material, a $(La,Sr)MnO_3$ material, a $Sr_{1-x}La_xTiO_3$ material, a $La_{1-x}Sr_xFeO_3$ material, a $La_{1-x}Sr_x$-$CoO_3$ material, a $SrFeO_{2.7}$ material, a $LaCoO_3$ material, a $RuSr_2GdCu_2O_3$ material, or a $YBa_2Cu_3O_7$ material.

In yet another embodiment, the resistive memory layer 120 may include a metal sulfide material, such as an $Ag_2S$ material, a $Cu_2S$ material, a CdS material, or a ZnS material. In still another embodiment, the resistive memory layer 120 may include a selenide material such as a $Ge_xSe_{1-x}$(Ag,Cu,Te-doped) material.

The selection element 32 may be electrically connected to the variable resistive element 31 in series. The selection element 32 may suppress the occurrence of a sneak current between the adjacent pillar-shaped structures 30 while the cross-point array device 1 operates. In an embodiment, an amount of the sneak current may be proportional to an amount of off-current of the selection element 32 when the selection element 32 is turned off.

In the selection element 32, the insulation layer 220 may include a silicon oxide material, a silicon nitride material, a metal oxide material, a metal nitride material, or a combination containing at least two materials thereof. In an embodiment, the insulation layer 220 may include an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, or an iron oxide material. The insulation layer 220 may include a compound material having a composition that does not satisfy a stoichiometric ratio. The insulation layer 220 may have an amorphous structure.

The selection element 32 may perform a threshold switching operation through a doping region formed in the insulation layer 220. At least a portion of the insulation layer 220 may include a threshold switching operation region, which is doped with N-type dopants or P-type dopants. A size of the threshold switching operation region may be controlled by a distribution area of the dopants.

In an embodiment, the dopants in the threshold switching operation region may have a different atomic value than silicon atoms or metal atoms constituting the insulation layer 220. Accordingly, the dopants may form trap sites for conductive carriers in the insulation layer 220. The trap sites may capture or conduct the conductive carriers, which move in the insulation layer 220 between the middle electrode 210 and the upper electrode 230, based on an external voltage applied to the insulation layer 220. The trap sites thereby provide a threshold switching characteristic, and are used to perform the threshold switching operation.

If the insulation layer 220 includes a silicon oxide material or a silicon nitride material, the dopants may include at least one of aluminum (Al), lanthanum (La), niobium (Nb), vanadium (V), tantalum (Ta), tungsten (W), chrome (Cr), and molybdenum (Mo). Specifically, if the insulation layer 220 is a silicon oxide layer, aluminum (Al) or lanthanum (La) may be used as P-type dopants, and at least one of niobium (Nb), vanadium (V), tantalum (Ta), tungsten (W), chrome (Cr), and molybdenum (Mo) may be used as N-type dopants.

If the insulation layer 220 includes an aluminum oxide material or an aluminum nitride material, at least one of titanium (Ti), copper (Cu), zirconium (Zr), hafnium (Hf), niobium (Nb), vanadium (V), tantalum (Ta), tungsten (W), chrome (Cr), and molybdenum (Mo) may be used as N-type dopants.

As described above, according to an embodiment, the threshold switching operation region of the selection element 32 may be formed by doping the insulation layer 220 of each of the pillar-shaped structures 30 with dopants. In an embodiment, the threshold switching operation region may have a smaller size than the insulation layer 220. In such a case, since the threshold switching operation region is smaller than the insulation layer 220, an off-current of the selection element 32 may be relatively reduced during the threshold switching operation.

The threshold switching operation region according to the aforementioned structure is fabricated by doping the insulation layer 220 with dopants instead of performing an additional etching process for reducing the size of the pillar-shaped structure 30. Thus, any potential degradation of the reliability of the ReRAM device due to changing a shape of the pillar-shaped structure 30 by an additional etching or patterning process may be prevented.

FIGS. 3A to 3D are cross-sectional views illustrating various switching elements 32A, 32B, 32C, and 32D, in respective pillar-shaped structures 30A, 30B, 30C, 30D, according to some embodiments. Any one of the switching elements 32A, 32B, 32C, and 32D illustrated in FIGS. 3A to 3D may be used as the selection element 32 of the cross-point array device 1 described with reference to FIGS. 1 and 2.

Figure 3A:
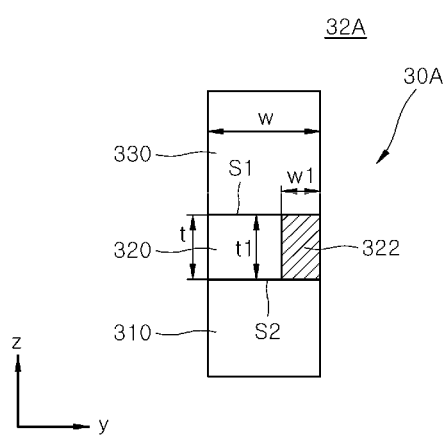
FIGS. 3A to 3D are cross-sectional views illustrating various switching elements according to some embodiments.

Referring to FIG. 3A, the switching element 32A may include a first electrode 310, an insulation layer 320, and a second electrode 330 that constitute the pillar-shaped structure 30A. The switching element 32A may include a threshold switching operation region 322 disposed in the insulation layer 320. The threshold switching operation region 322 may extend from a sidewall of the insulation layer 320 to an inside region of the insulation layer 320. The threshold switching operation region 322 may be formed by doping a portion of the insulation layer 320 with N-type dopants or P-type dopants. The N-type dopants or the P-type dopants may form trap sites, which are capable of capturing or moving conductive carriers.

The threshold switching operation region 322 may have a width w1 that is smaller than a width w of the insulation layer 320 in a width direction (e.g., the Y-direction) of the pillar-shaped structure 30A. In some embodiments, the width w1 of the threshold switching operation region 322 may vary along the Z-direction. In addition, the threshold switching operation region 322 may have a thickness t1 that is substantially equal to a thickness t of the insulation layer 320. That is, the threshold switching operation region 322 may extend in the Z-direction from an interface S1 between the insulation layer 320 and the second electrode 330 to an interface S2 between the insulation layer 320 and the first electrode 310.

When an external voltage is applied to the switching element 32A, the threshold switching operation of the switching element 32A may be performed in the threshold switching operation region 322. Movement of the conductive carriers may be suppressed in areas of the insulation layer 320 outside the threshold switching operation region 322 when the external voltage is applied to the switching element 32A.

As described above, the threshold switching operation region 322 of the selection element 32A may be confined to a portion of the insulation layer 320. An off-current of the selection element 32A, when the threshold switching operation region 322 occupies a portion of the insulation layer 320, may be lower than an off-current when the threshold switching occupation region 322 occupies the entire insulation layer 320. Thus, if the selection element 32 of the cross-point array device is the selection element 32A of FIG. 3A, the selection element 32A may have a low off-current when the selection element 32A is turned off, because the threshold switching operation region 322 is confined to a smaller region than the insulation layer 320.

Figure 3B:
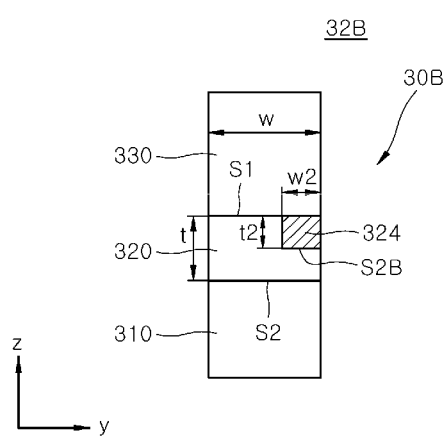

Referring to FIG. 3B, the switching element 32B may include a threshold switching operation region 324, and the threshold switching operation region 324 may have a width w2, which is smaller than the width w of an insulation layer 320 in a width direction (e.g., the Y-direction) of the pillar-shaped structure 30B. In some embodiments, the width w2 of the threshold switching operation region 324 may vary along the Z-direction.

The threshold switching operation region 324 may have a thickness t2, which is smaller than the width t of the insulation layer 320 in the Z-direction. The threshold switching operation region 324 may extend from the interface S1 between the insulation layer 320 and the second electrode 330 to an interface S2B in a bulk region of the insulation layer 320.

As such, when an external voltage is applied to the switching element 32B, the threshold switching operation of the switching element 32B may be performed through a region of the insulation layer 320 disposed between the threshold switching operation region 324 and the first electrode 310 as well as through the threshold switching operation region 324. More specifically, when the switching element 32B is turned on, conductive carriers that reach the interface S2B from the second electrode 330 through the threshold switching operation region 324 may move into the first electrode 310 through the region of the insulation layer 320 disposed between the threshold switching operation region 324 and the first electrode 310. The region of the insulation layer 320 disposed between the threshold switching operation region 324 and the first electrode 310 may additionally reduce an off-current of the switching element 32B when the switching element 32B is turned off.

Figure 3C:
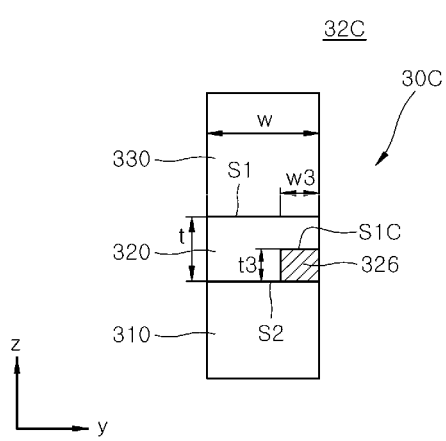

Referring to FIG. 3C, the switching element 32C may include a threshold switching operation region 326, and the threshold switching operation region 326 may have a width w3 that is smaller than the width w of the insulation layer 320 in a width direction (e.g., the Y-direction) of the pillar-shaped structure 30C. In some embodiments, the width w3 of the threshold switching operation region 326 may vary along the Z-direction.

The threshold switching operation region 326 may have a thickness t3 that is smaller than the thickness t of the insulation layer 320 in the Z-direction. The threshold switching operation region 326 may be extend from the interface S2 between the insulation layer 320 and the first electrode 310 to an interface S1C in a bulk region of the insulation layer 320.

When an external voltage is applied to the switching element 32C, the threshold switching operation of the switching element 32C may be performed in the threshold switching operation region 326 as well as in a region of the insulation layer 320 disposed between the threshold switching operation region 326 and the second electrode 330. More specifically, when the switching element 32C is turned on, the conductive carriers reaching the interface S1C from the first electrode 310 through the threshold switching operation region 326 may move into the second electrode 330 through the region of the insulation layer 320 disposed between the threshold switching operation region 326 and the second electrode 330.

Thus, the region of the insulation layer 320 disposed between the threshold switching operation region 326 and the second electrode 330 may additionally reduce an off-current of the switching element 32C when the switching element 32C is turned off.

Figure 3D:
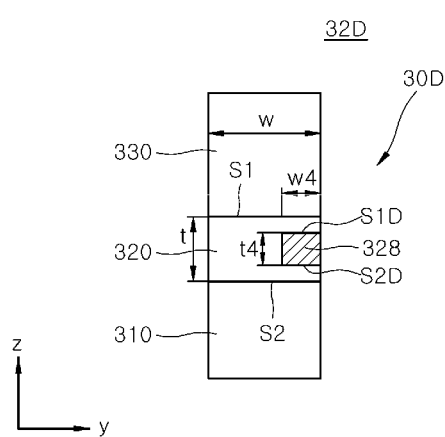

Referring to FIG. 3D, the switching element 32D may include a threshold switching operation region 328, and the threshold switching operation region 328 may have a width w4 that is smaller than the width w of the insulation layer 320 in a width direction (e.g., the Y-direction) of the pillar-shaped structure 30D. In some embodiments, the width w4 of the threshold switching operation region 328 may vary along the Z-direction.

The threshold switching operation region 328 may have a thickness t4 that is smaller than the thickness t of the insulation layer 320 in the Z-direction. The threshold switching operation region 328 may be disposed between one interface S1D in a bulk region of the insulation layer 320 and another interface S2D in the bulk region of the insulation layer 320. The interface S2D may be disposed at a lower level than the interface S1D. In other words, a distance between the interface S2D and the first electrode 310 may be smaller than a distance between the interface S1D and the first electrode 310.

When an external voltage is applied to the switching element 32D, the threshold switching operation may be performed in regions of the insulation layer 320 disposed between the threshold switching operation region 328 and the first and second electrodes 310 and 330 as well as in the threshold switching operation region 328. The regions of the insulation layer 320 disposed between the threshold switching operation region 328 and the first and second electrodes 310 and 330 may suppress an off-current when the switching element 32D is turned off, and may be tunneled with conductive carriers when the switching element 32D is turned on.

In the above embodiments described with reference to FIGS. 3A to 3D, each of the threshold switching operation regions 322, 324, 326, and 328 of the switching elements 32A, 32B, 32C, and 32D is illustrated to extend from one sidewall of the insulation layer 320 to an inside region of the insulation layer 320. However, the present disclosure is not limited thereto. In some embodiments, each of the threshold switching operation regions 322, 324, 326, and 328 may extend from both sidewalls of the insulation layer 320 to an inside region of the insulation layer 320, such that the threshold switching operation regions 322, 324, 326, and 328 may be disposed against at least two sides of the inside region of the insulation layer 320.

A size or a width of each of the threshold switching operation regions 322, 324, 326, and 328 may be controlled by a distribution area of dopants in the insulation layer 320. The dopants may be injected into the insulation layer 320 and may dope the insulation layer 320 to form an N-type region or a P-type region in the insulation layer 320. In the embodiments illustrated in FIGS. 3A to 3D, each of the threshold switching operation regions 322, 324, 326, and 328 of the switching elements 32A, 32B, 32C and 32D is smaller than the insulation layer 320. However, the present disclosure is not limited thereto. In some embodiments, a size or a width of each of the threshold switching operation regions 322, 324, 326, and 328 may be controlled to be substantially equal to a size or a width of the insulation layer 320.

Hereinafter, a method of forming a threshold switching operation region of a switching element in a pillar-shaped structure according to an embodiment will be described.

Figure 4:
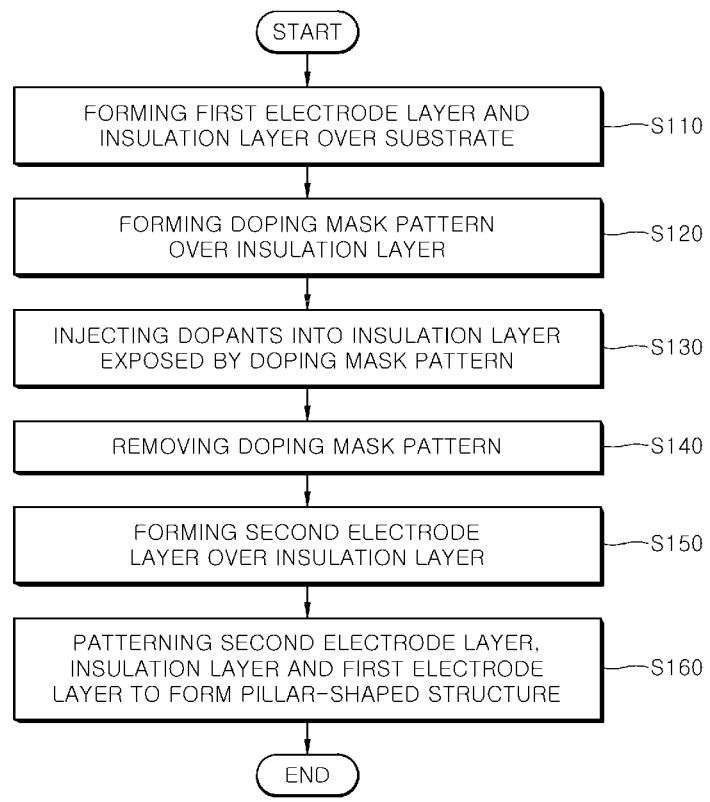
FIG. 4 is a flow chart illustrating a method of manufacturing a switching element according to an embodiment.

FIG. 4 is a flow chart schematically illustrating a method of manufacturing a switching element according to an embodiment. The method illustrated in FIG. 4 may be applied to a method of manufacturing the selection elements 32 of the cross-point array device 1 described with reference to FIGS. 1 and 2.

Referring to FIG. 4, a first electrode layer and an insulation material layer may be sequentially formed on a substrate at S110. The first electrode layer may include any one of a metal material, a conductive nitride material, and a conductive oxide material. In an embodiment, the first electrode layer may include any one of gold (Au), aluminum (Al), platinum (Pt), copper (Cu), silver (Ag), ruthenium (Ru), titanium (Ti), iridium (Ir), tungsten (W), titanium nitride(TiN), tantalum nitride (TaN), and ruthenium oxide ($RuO_2$).

The insulation material layer may include any one of a silicon oxide material, a silicon nitride material, a metal oxide material, and a metal nitride material, or a combination of two or more materials thereof. In an embodiment, the metal nitride material may include any one of an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, and an iron oxide material, or a combination of two or more materials thereof.

A doping mask pattern may be formed on the insulation material layer at S120. The doping mask pattern may expose a portion of the insulation material layer overlapping a pillar-shaped structure forming region where pillar-shaped structures are to be formed through subsequent processes. In an embodiment, the doping mask pattern may be a photoresist pattern or a hard mask pattern.

A doping process may be applied to the insulation material layer to inject N-type dopants or P-type dopants into the exposed portion of the insulation material layer at S130. The dopants may include at least one selected from aluminum (Al), lanthanum (La), niobium (Nb), vanadium (V), tantalum (Ta), tungsten (W), chrome (Cr), molybdenum (Mo), titanium (Ti), copper (Cu), zirconium (Zr) and hafnium (Hf), or a combination of two or more elements thereof.

The doping process may be implemented by an ion implantation process. As a result of the ion implantation process, dopant distribution regions may be formed in the insulation material layer. In an embodiment, each of the dopant distribution regions may be formed from a surface of the insulation material layer to an interface between the insulation material layer and the first electrode layer. In another embodiment, at least one boundary of each of the dopant distribution regions may be located within a bulk region of the insulation material layer.

The doping mask pattern may be removed at S140. In an embodiment, if the doping mask pattern is a photoresist pattern, the doping mask pattern may be removed by a plasma ashing process. In another embodiment, if the doping mask pattern is a hard mask pattern, the doping mask pattern may be removed using a wet etching process, a dry etching process, or a combination thereof.

A second electrode layer may be formed on the insulation material layer at S150. In an embodiment, the second electrode layer may include a metal material, a conductive nitride material, or a metal oxide material. In an embodiment, the second electrode layer may include any one of gold (Au), aluminum (Al), platinum (Pt), copper (Cu), silver (Ag), ruthenium (Ru), titanium (Ti), iridium (Ir), tungsten (W), titanium nitride(TiN), tantalum nitride (TaN), and ruthenium oxide ($RuO_2$).

The second electrode layer, the insulation material layer, and the first electrode layer may be patterned to form the pillar-shaped structures at S160. Each of the pillar-shaped structures may include a first electrode, an insulation layer, and a second electrode obtained by the patterning process. Each of the pillar-shaped structures may be disposed on the substrate.

At least a portion of the insulation material layer may include the dopant distribution region. When forming the pillar-shaped structures, the second electrode layer, the insulation material layer, and the first electrode layer may be patterned to include the portion of the insulation material layer including the dopant distribution region, in which the dopants are injected at S130. In an embodiment, in a case in which the insulation material layer is cut off along a direction that is nonparallel to a height direction of the pillar-shaped structure, the dopant distribution regions may cover a portion of the insulation material layer at a surface of the cut-off insulation material layer. The dopant distribution regions may be regions where the threshold switching operation of the switching element is performed.

The switching elements may be formed by performing some of the processes described above, including S110 to S160. In the method of forming the switching elements according to the above embodiment, the pillar-shaped structures, each of which includes a dopant distribution region, may be formed by selectively doping the insulation material layer using a doping mask pattern. The insulation material layer may be patterned into structures that each include a doped region. In each of the switching elements according to an embodiment, since each of the doped regions of the insulation layer acts as a threshold switching operation region, a size of each of the switching elements can be easily controlled even without additional processes that modify the shapes of the pillar-shaped structures.

Various methods of manufacturing switching elements and a ReRAM device employing the switching elements as selection elements will be described more fully hereinafter.

FIGS. 5A, 6A, 7A, 8A, 9A, 10A, 11A, and 12A are plan views illustrating a method of manufacturing a ReRAM device according to an embodiment. FIGS. 5B, 6B, 7B, 8B, 9B, 10B, 11B, and 12B are cross-sectional views taken along lines I-I' of FIGS. 5A, 6A, 7A, 8A, 9A, 10A, 11A, and 12A, respectively. FIGS. 5C, 6C, 7C, 8C, 9C, 10C, 11C, and 12C are cross-sectional views taken along lines II-II' of FIGS. 5A, 6A, 7A, 8A, 9A, 10A, 11A, and 12A, respectively.

Figure 13A:
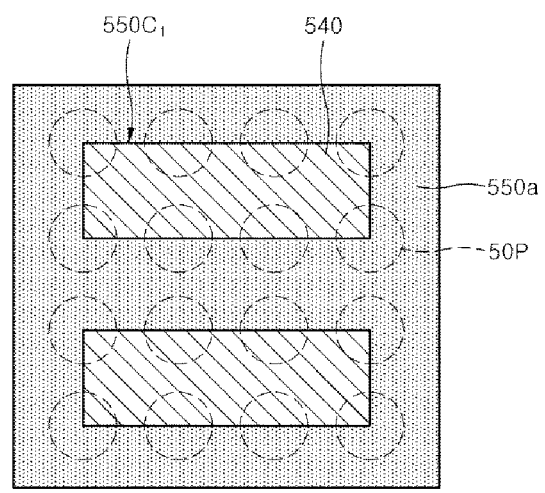
FIGS. 13A and 13B are plan views illustrating a method of manufacturing a resistive random access memory (ReRAM) device according to an embodiment.
Figure 13B:
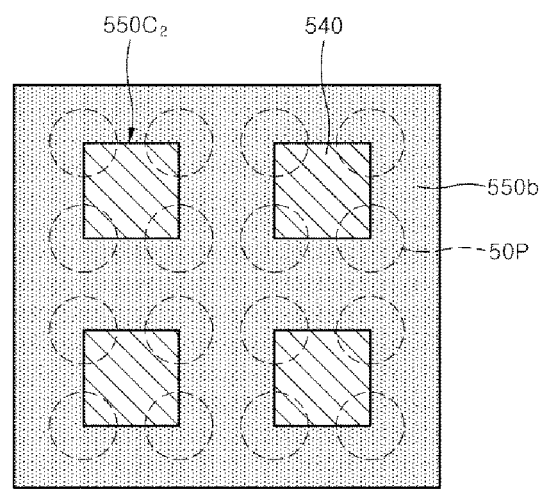

FIGS. 13A and 13B are plan views illustrating a method of manufacturing a ReRAM element according to another embodiment.

Figure 5A:
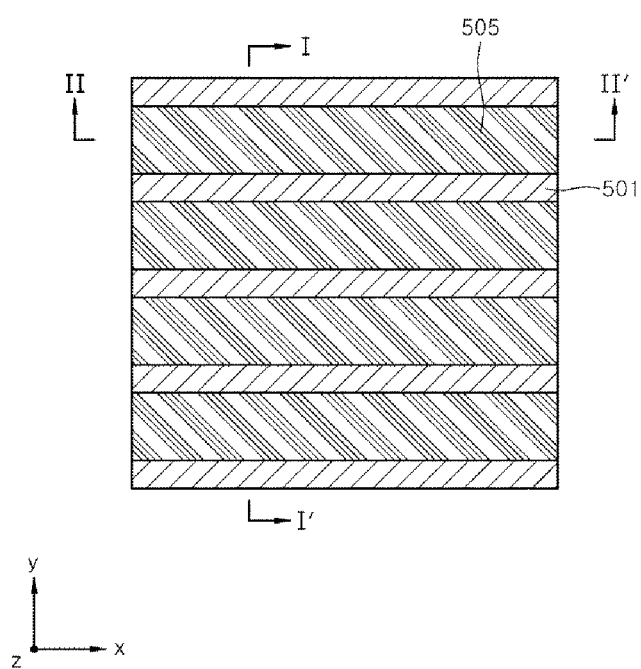
FIGS. 5A, 6A, 7A, 8A, 9A, 10A, 11A, and 12A are plan views illustrating a method of manufacturing a resistive random access memory (ReRAM) device according to an embodiment.
Figure 5B:
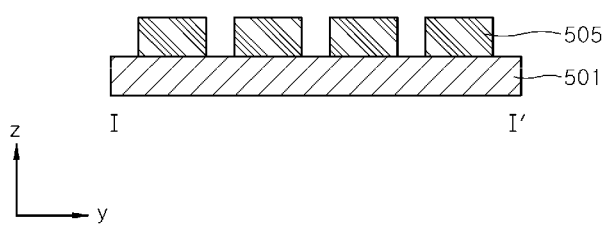
FIGS. 5B, 6B, 7B, 8B, 9B, 10B, 11B, and 12B are cross-sectional views taken along lines I-I' of FIGS. 5A, 6A, 7A, 8A, 9A, 10A, 11A, and 12A, respectively.
Figure 5C:
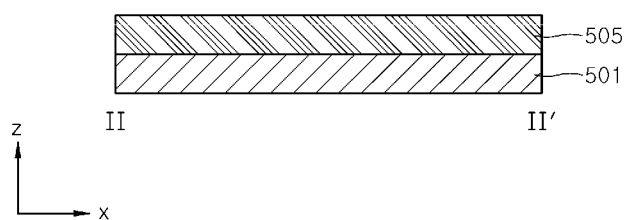
FIGS. 5C, 6C, 7C, 8C, 9C, 10C, 11C, and 12C are cross-sectional views taken along lines II-II' of FIGS. 5A, 6A, 7A, 8A, 9A, 10A, 11A, and 12A, respectively.

Referring to FIGS. 5A, 5B, and 5C, lower conductive lines 505 may be formed on a substrate 501. In an embodiment, a process for forming the lower conductive lines 505 may include forming a conductive layer on the substrate 501 and patterning the conductive layer using a lithography process and/or an etching process. A known sputtering process, an atomic layer deposition (ALD) process, an evaporation process, a chemical vapor deposition (CVD), or a combination thereof may be employed to form the conductive layer. The lower conductive lines 505 may include a metal material, a conductive metal nitride material, or a conductive metal oxide material.

The substrate 501 may be a silicon substrate or a gallium arsenide substrate. However, the present disclosure is not limited thereto. In some embodiments, the substrate 501 may be a ceramic substrate, a polymer substrate, or a metallic substrate to which semiconductor processes are applicable. The substrate 501 may include an integrated circuit therein.

Figure 6A:
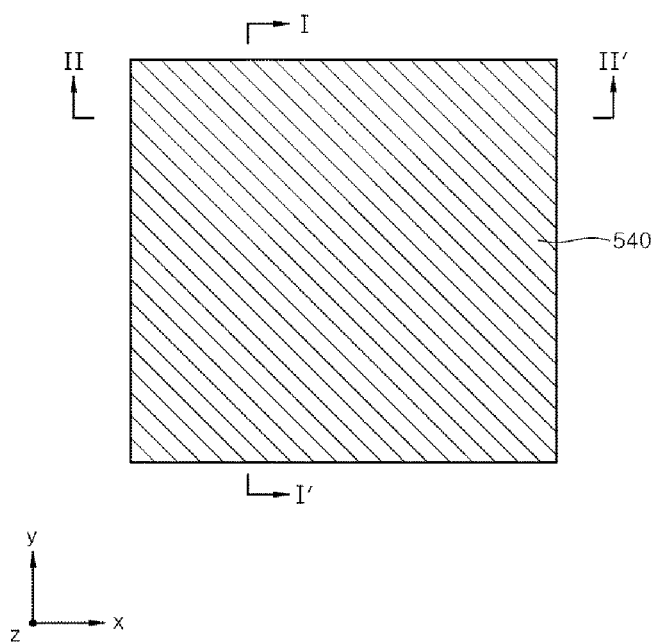
Figure 6B:
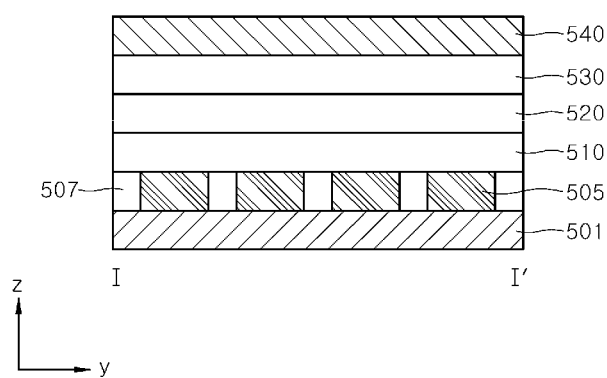
Figure 6C:
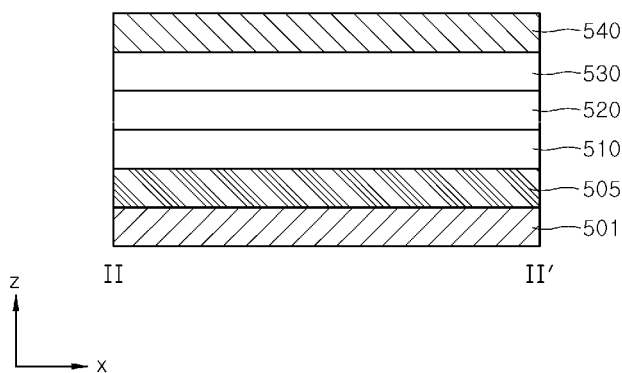

Referring to FIGS. 6A, 6B, and 6C, a lower insulation layer 507 may be formed in spaces between the lower conductive lines 505. Subsequently, a lower electrode layer 510, a resistive memory material layer 520, a middle electrode layer 530, and an insulation material layer 540 may be sequentially formed on the lower conductive lines 505 and the lower insulation layer 507.

Each of the lower electrode layer 510 and the middle electrode layer 530 may include a metal material, a conductive metal nitride material, or a conductive metal oxide material. In an embodiment, each of the lower electrode layer 510 and the middle electrode layer 530 may include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), or ruthenium oxide ($RuO_2$). Each of the lower electrode layer 510 and the middle electrode layer 530 may be formed using a sputtering process, an atomic layer deposition (ALD) process, an evaporation process, a chemical vapor deposition (CVD) process, or an electron beam deposition process.

In an embodiment, the resistive memory material layer 520 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material. In another embodiment, the resistive memory material layer 520 may include a perovskite material such as a praseodymium calcium manganese oxide ($Pr_{0.7}Ca_{0.3}MnO_3$) material, a $La_{1-x}Ca_xMnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a (Ba,Sr)$TiO_3$(Cr,Nb-doped) material, a $SrZrO_3$(Cr,V-doped) material, a (La,Sr)$MnO_3$ material, a $Sr_{1-x}La_xTiO_3$ material, a $La_{1-x}Sr_xFeO_3$ material, a $La_{1-x}Sr_x$-$CoO_3$ material, a $SrFeO_{2.7}$ material, a $LaCoO_3$ material, a $RuSr_2GdCu_2O_3$ material, or a $YBa_2Cu_3O_7$ material. In yet another embodiment, the resistive memory material layer 520 may include a metal sulfide material, such as an $Ag_2S$ material, a $Cu_2S$ material, a CdS material, or a ZnS material. In still another embodiment, the resistive memory material layer 520 may include a selenide material such as a $Ge_xSe_{1-x}$ (Ag,Cu,Te-doped) material. The resistive memory material layer 520 may be formed using a sputtering process, an atomic layer deposition (ALD) process, an evaporation process, a chemical vapor deposition (CVD) process, or an electron beam deposition process.

The insulation material layer 540 may include any one of a silicon oxide material, a silicon nitride material, a metal oxide material, and a metal nitride material, or a combination containing at least two materials thereof. For example, the insulation material layer 540 may include an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, or an iron oxide material.

The insulation material layer 540 may be formed using a sputtering process, an atomic layer deposition (ALD) process, an evaporation process, a chemical vapor deposition (CVD) process, or an electron beam deposition process. The insulation material layer 540 may include a material that does not satisfy a stoichiometric ratio. The insulation material layer 540 may have an amorphous structure.

Figure 7A:
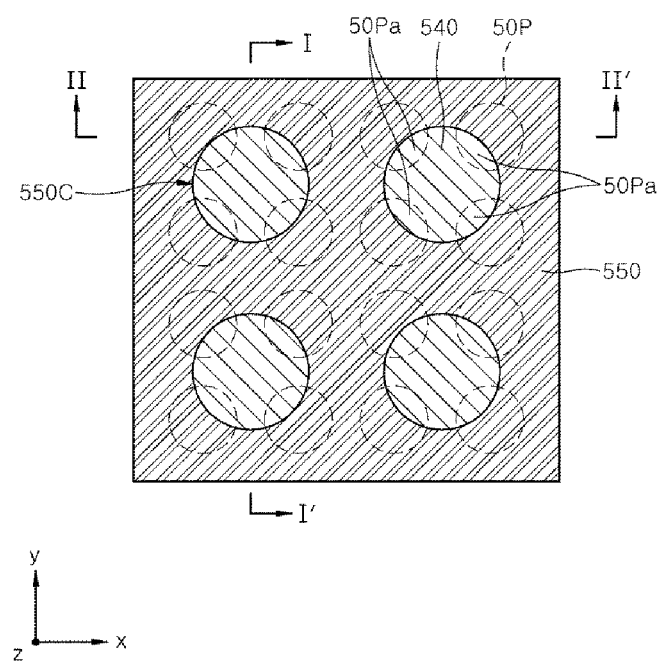
Figure 7B:
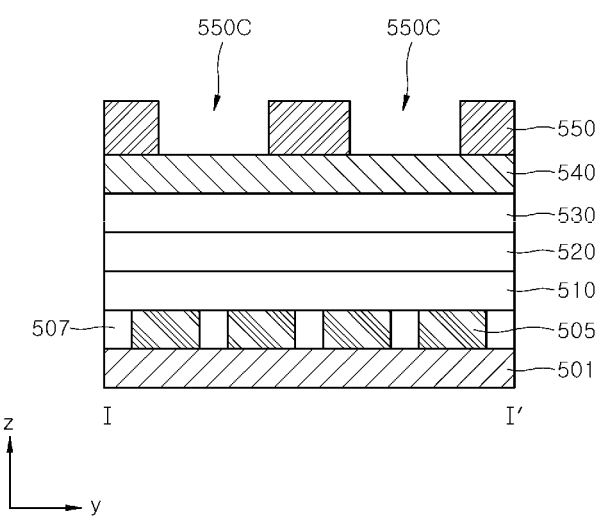
Figure 7C:
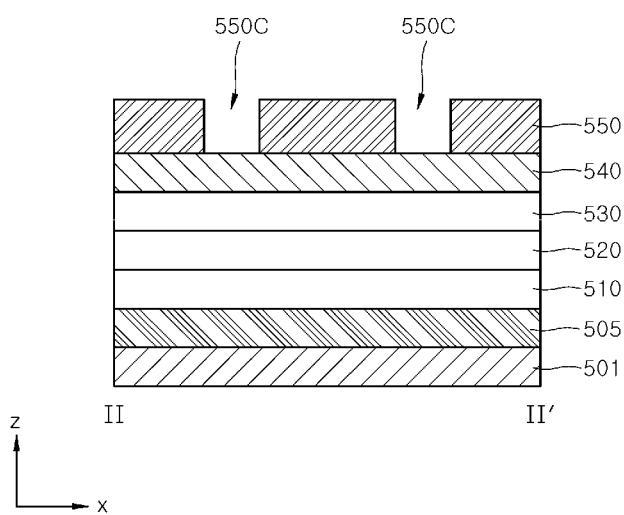

Referring to FIGS. 7A, 7B, and 7C, a doping mask pattern 550 may be formed on the insulation layer 540, and may include openings 550C that expose portions of the insulation material layer 540. The portions of the insulation material layer 540 exposed by the doping mask pattern 550 may overlap at least a portion of pillar-shaped structure forming regions 50P. Each of the pillar-shaped structure forming regions 50P is a region corresponding to an insulation layer 545 of a pillar-shaped structure 50, which is to be formed on the substrate 501 by performing subsequent processes to be described later with respect to FIGS. 10A and 11A, FIGS. 10B and 11B, and FIGS. 10C and 11C.

In the plan view of FIG. 7A, the portions of the insulation material layer 540 exposed by the doping mask pattern 550 may overlap the pillar-shaped structure forming regions 50P at overlap regions 50Pa. As illustrated in the drawings, each of the exposed portions of the insulation material layer 540 overlaps four pillar-shaped structure forming regions 50P. However, the present disclosure is not limited thereto. In some embodiments, each of the exposed portions of the insulation material layer 540 may overlap with various numbers of the pillar-shaped structure forming regions 50P.

For each opening 550C, i.e., each of the exposed portions of the insulation material layer 540, the overlap regions 50Pa of the pillar-shaped structure forming regions 50P may face each other. More specifically, the overlap regions 50Pa of the pillar-shaped structure forming regions 50P may be formed symmetrically with respect to a center of each opening 550C of the doping mask pattern 550. For example, referring to FIG. 7A, the four overlap regions 50Pa corresponding to the four pillar-shaped structure forming regions 50P may have rotational symmetry about the center of each opening 550C of the doping mask pattern 550.

Figure 8A:
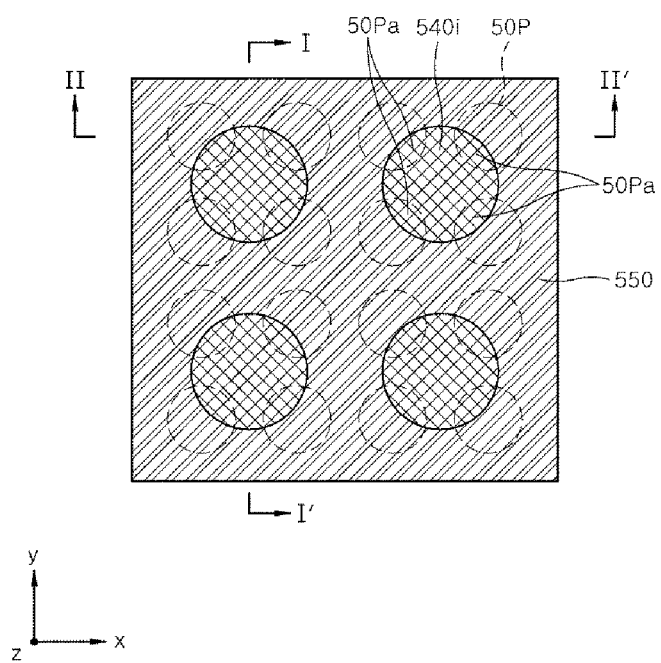
Figure 8B:
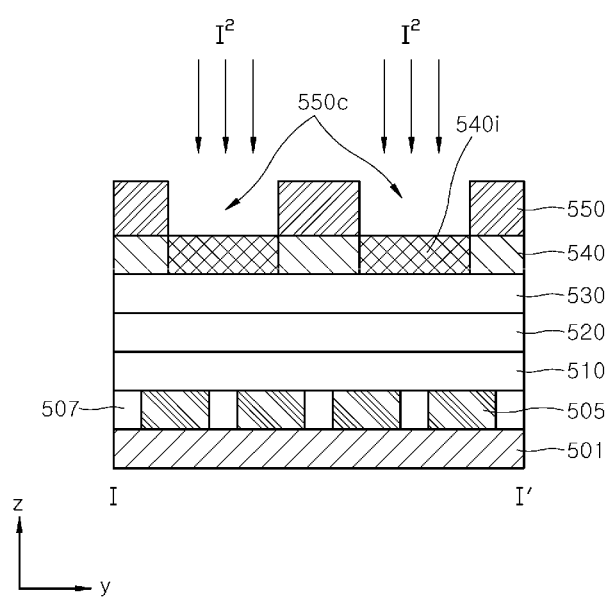
Figure 8C:
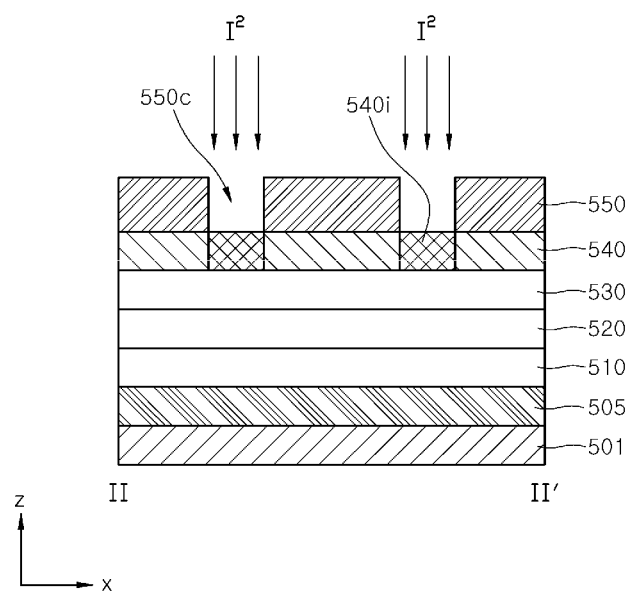

Referring to FIGS. 8A, 8B, and 8C, dopants may be injected into the portions of the insulation material layer 540 that are exposed by the doping mask pattern 550, thereby forming dopant distribution regions 540i in the insulation material layer 540. The dopants injected into the insulation material layer 540 may include any one of aluminum (Al), lanthanum (La), niobium (Nb), vanadium (V), tantalum (Ta), tungsten (W), chrome (Cr), molybdenum (Mo), titanium (Ti), copper (Cu), zirconium (Zr), and hafnium (Hf), or a combination of two or more elements thereof.

In some embodiments, a process for injecting the dopants may be performed by doping the insulation material layer 540 with N-type dopants or P-type dopants. As illustrated in FIG. 8A, the dopant distribution regions 540i may cover the overlap regions 50Pa of the pillar-shaped structure forming regions 50P. Each of the portions of the dopant distribution regions 540i in the pillar-shaped structure forming regions 50P may face the dopant distribution region 540i in the adjacent pillar-shaped structure forming region 50P. The two adjacent dopant distribution regions 540i facing each other are included in an area corresponding to a portion of the insulation material layer 540 that is exposed by a single opening 550C of the doping mask pattern 550.

In some embodiments, the doping process may be performed using an ion implantation process. In the ion implantation process, ions $I^2$ may be implanted into a doping region. A size of the doping region and a doping concentration may be adjusted by controlling process conditions such as an ion dose or an implantation energy. In an embodiment, as illustrated in FIGS. 8B and 8C, the ion implantation process may be performed such that a lower boundary of each of the dopant distribution regions 540i is disposed against an upper surface of the middle electrode layer 530. Accordingly, the dopant distribution regions 540i may have substantially the same dopant distribution as the threshold switching operation region 322 in the insulation layer 320, described above with reference to FIG. 3A.

In another embodiment, the ions $I^2$ may be implanted such that at least one boundary of each of the dopant distribution regions 540i is formed in a bulk region of the insulation material layer 540. Therefore, the dopant distribution regions 540i may be formed to have substantially the same dopant distribution as any one of the threshold switching operation regions 324, 326, and 328 of the switching elements 32B, 32C, and 32D that are described with reference to FIGS. 3B to 3D, respectively.

After finishing the dopant injection process, the doping mask pattern 550 may be removed. In an embodiment in which the doping mask pattern 550 is a photoresist pattern, the photoresist pattern may be removed using a plasma ashing process. In another embodiment, when the doping mask pattern 550 is a hard mask pattern, the hard mask pattern may be removed using a wet etching process, a dry etching process, or a combination thereof.

Figure 9A:
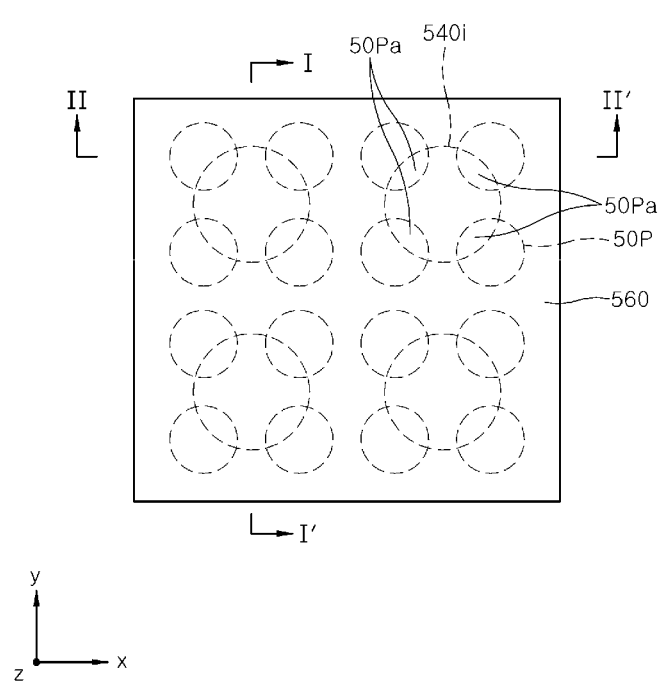
Figure 9B:
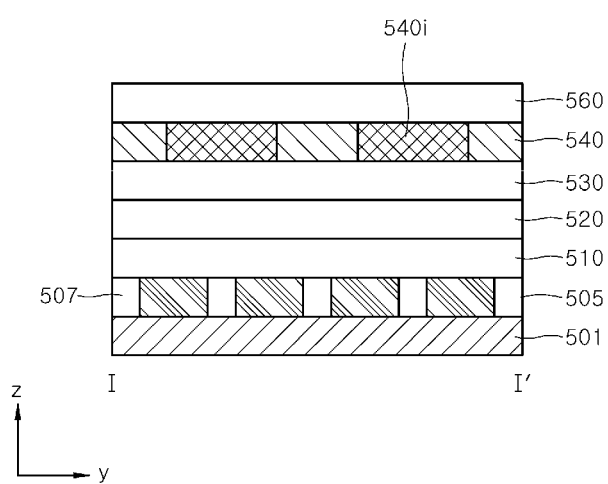
Figure 9C:
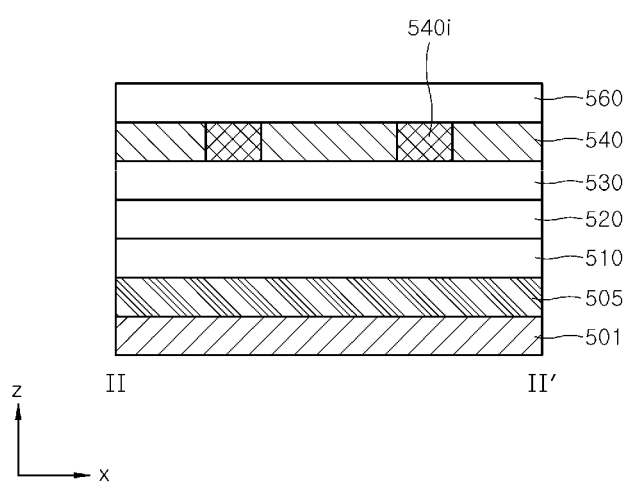

Referring to FIGS. 9A, 9B, and 9C, an upper electrode layer 560 may be formed on the insulation material layer 540. The upper electrode layer 560 may include a metal, a conductive nitride material, or a conductive oxide material. In an embodiment, the upper electrode layer 560 may include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), or ruthenium oxide ($RuO_2$). The upper electrode layer 560 may be formed using a sputtering process, an atomic layer deposition (ALD) process, an evaporation process, a chemical vapor deposition (CVD) process, or an electron beam deposition process.

Figure 10A:
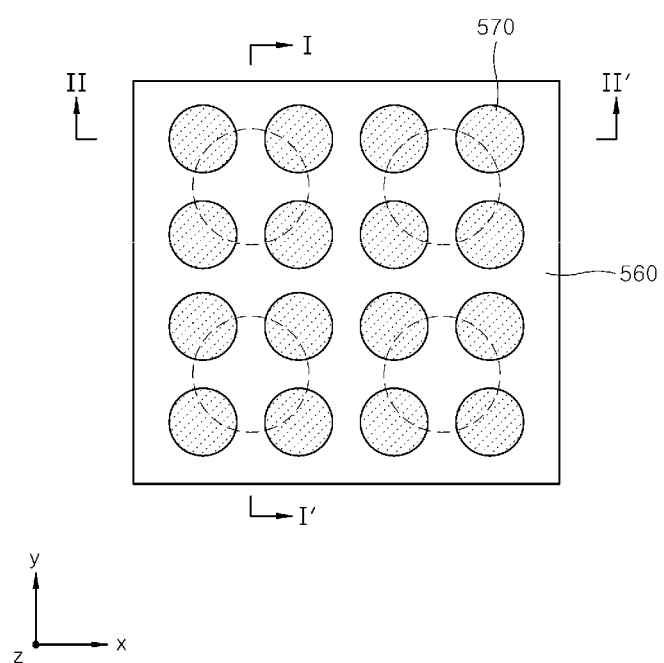
Figure 10B:
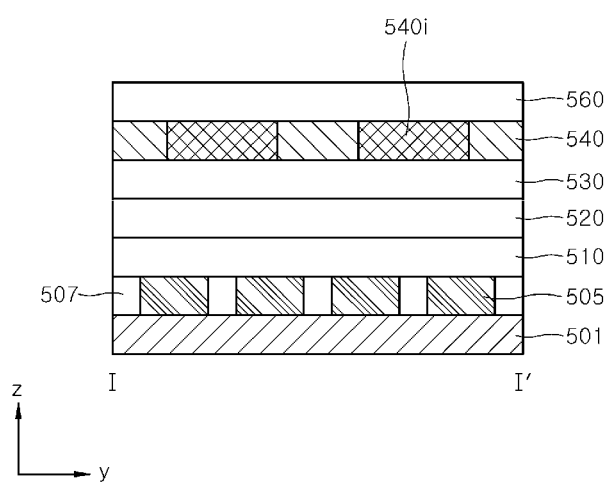
Figure 10C:
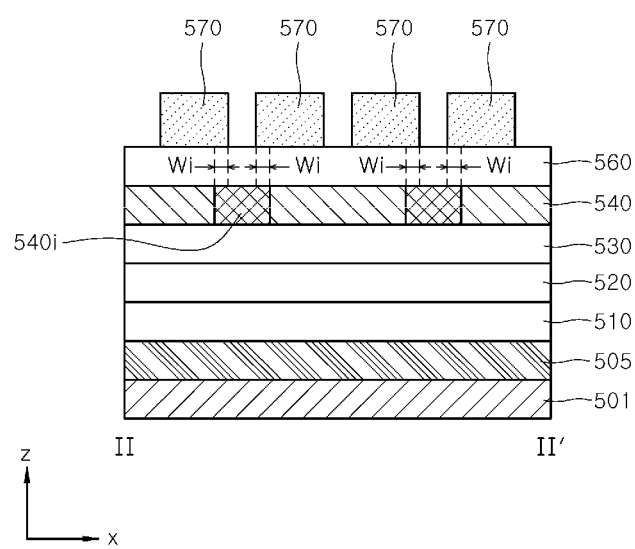

Referring to FIGS. 10A, 10B, and 10C, pillar forming mask patterns 570 may be formed on the upper electrode layer 560. In an embodiment, the pillar forming mask pattern 570 may include a photoresist pattern, a hard mask pattern, or a combination thereof. The pillar forming mask patterns 570 may correspond to the pillar forming regions 50P illustrated in FIGS. 7A, 8A, and 9A. Accordingly, as illustrated in FIGS. 10A and 10C, the pillar forming mask pattern 570 may overlap with at least a portion of the dopant distribution region 540i. That is, the portion of the dopant distribution region 540i may be disposed underneath the pillar forming mask pattern 570. In an embodiment, as illustrated in FIG. 10C, the pillar forming mask pattern 570 may overlap the dopant distribution region 540i by a predetermined width Wi.

Figure 11A:
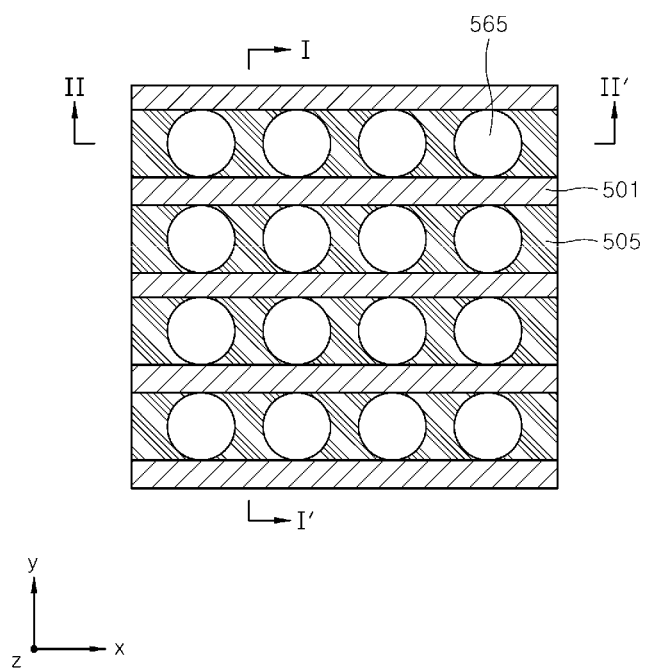
Figure 11B:
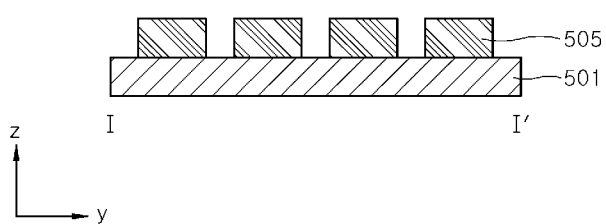
Figure 11C:
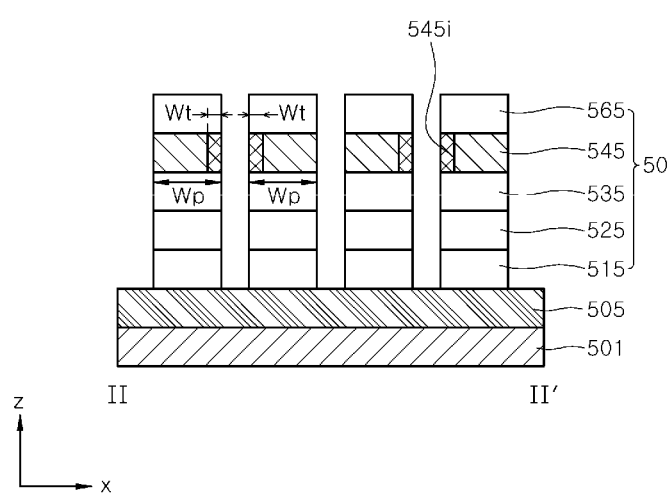

Referring to FIGS. 11A, 11B, and 11C, the upper electrode layer 560, the insulation material layer 540, the middle electrode layer 530, the resistive memory material layer 520, and the lower electrode layer 510 may be patterned using the pillar forming mask patterns 570 as an etching mask, in order to form pillar-shaped structures 50 on the lower conductive lines 505. Each of the pillar-shaped structures 50 may include a lower electrode 515, a resistive memory layer 525, a middle electrode 535, an insulation layer 545, and an upper electrode 565 that are obtained by the patterning process.

The pillar-shaped structures 50 may cover the pillar forming regions 50P illustrated in FIGS. 7A, 8A, and 9A. The lower insulation layer 507 of FIG. 10B may be removed during the patterning process. Referring to FIG. 11C, the patterned insulation layer 545 in each pillar-shaped structure 50 may include one of patterned dopant distribution regions 545i. A size of each of the patterned dopant distribution regions 545i included in the patterned insulation layer 545 illustrated in FIGS. 11A, 11B, and 11C, may be determined by a size of an overlapping area between the pillar forming mask pattern 570 and the dopant distribution region 540i in the insulation layer 540 illustrated in FIGS. 10A, 10B, and 10C.

FIG. 11C illustrates a width Wp of the patterned insulation layer 545 in the pillar-shaped structure 50 compared to a width Wt of the patterned dopant distribution region 545i. As shown in FIG. 11C, the patterned dopant distribution region 545i of each pillar-shaped structure 50 may face the patterned dopant distribution region 545i of the adjacent pillar-shaped structure 50. The two adjacent dopant distribution regions 545i facing each other are included in an area corresponding to a portion of the insulation material layer 540 that is exposed by a single opening 550C of the doping mask pattern 550.

Figure 12A:
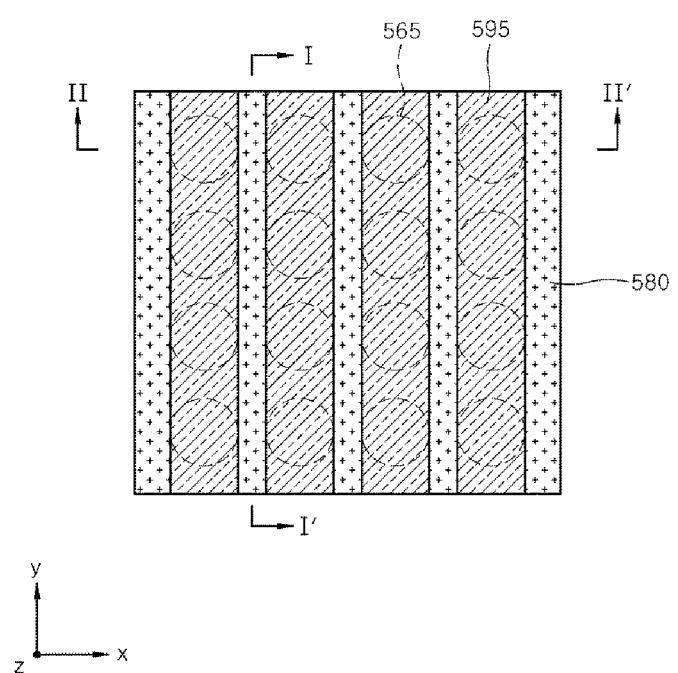
Figure 12B:
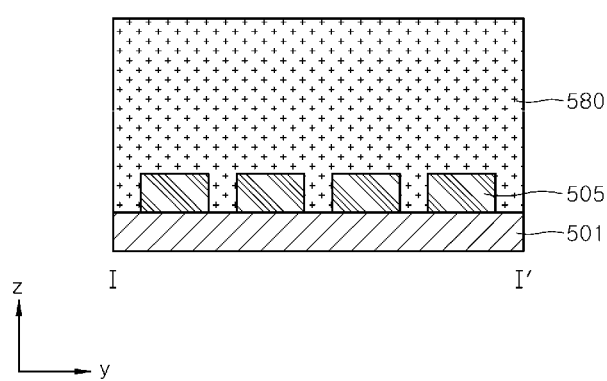
Figure 12C:
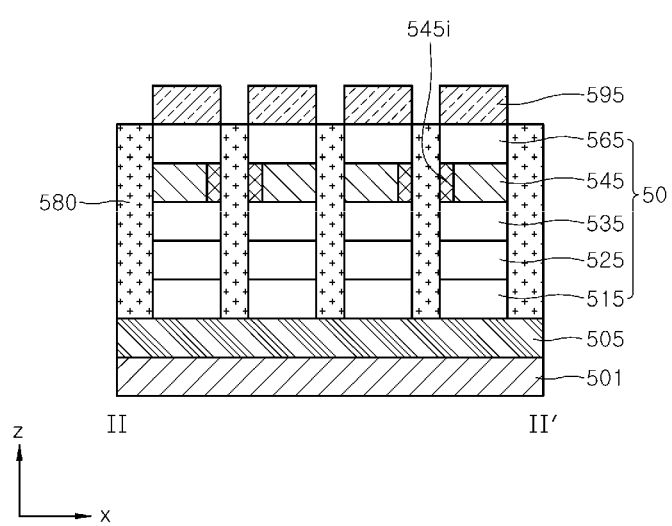

Referring to FIGS. 12A, 12B, and 12C, an interlayer insulation layer 580 may fill spaces between the pillar-shaped structures 50. In some embodiments, the interlayer insulation layer 580 may include an oxide material, a nitride material, or an oxy-nitride material. In some embodiments, the interlayer insulation layer 580 may be formed using a coating process or a chemical vapor deposition (CVD) process. Subsequently, upper conductive lines 595 may be formed on the upper electrodes 565 and the interlayer insulation layer 580. The upper conductive lines 595 may be nonparallel with the lower conductive lines 505.

In an embodiment, the upper conductive lines 595 may be formed by forming a conductive layer on the upper electrodes 565 and the interlayer insulation layer 580, and patterning the conductive layer in line shapes. In some embodiments, the conductive layer may be formed using any one of a sputtering process, an atomic layer deposition (ALD) process, an evaporation process, and a chemical vapor deposition (CVD) process. The upper conductive lines 595 may include a metal material, a conductive metal nitride material, or a conductive metal oxide material. A ReRAM device may be fabricated by the above processes according to an embodiment.

In some embodiments, in the process of forming the doping mask pattern 550 described with respect to FIGS. 7A, 7B, and 7C, the doping mask pattern may be modified into various shapes. In an embodiment, a doping mask pattern 550a may include rectangular openings $550C_1$, as shown in FIG. 13A. Alternatively, as shown in FIG. 13B, a doping mask pattern 550b may include square openings 550C₂. As such, a size of a doping region in the insulation material layer 540 may be controlled by controlling a shape and a size of the doping mask pattern 550.

Referring back to FIGS. 12A, 12B, and 12C, the ReRAM device may include the lower conductive lines 505 and the upper conductive lines 595, which are nonparallel with each other. In addition, the ReRAM device may include an array of the pillar-shaped structures 50 which are located at cross points of the lower conductive lines 505 and the upper conductive lines 595. Each of the pillar-shaped structures 50 may include a variable resistive element and a selection element. The variable resistive element may include the lower electrode 515, the resistive memory layer 525, and the middle electrode 535.

The selection element may include the middle electrode 535, the insulation layer 545 in which the dopant distribution region 545i is formed, and the upper electrode 565. In an embodiment, in a case in which the insulation layer 545 is cut off along a direction that is nonparallel to a height direction of the pillar-shaped structure 50, the dopant distribution region 545i may cover a portion of the insulation layer 545 at a surface of the cut-off insulation layer 545. The dopant distribution region 545i may extend from an outer peripheral surface of the pillar-shaped structures 50 to an inside region of the pillar-shaped structures 50. Each dopant distribution region 545i may be a threshold switching operation region of a corresponding selection element. A dopant distribution region 545i of each pillar-shaped structure 50 may face another dopant distribution region 545i of an adjacent pillar-shaped structure 50. The two adjacent dopant distribution regions 545i facing each other are included in an area corresponding to a portion of the insulation material layer 540 that is exposed by a single opening 550C of the doping mask pattern 550.

In another embodiment, in a process described with reference to FIGS. 6A, 6B, and 6C, the middle electrode layer 530 and the insulation material layer 540 may be formed on the lower conductive lines 505 and the lower insulation layer 507 without forming the lower electrode layer 510 and the resistive memory material layer 520. Subsequently, processes described with reference to FIGS. 7A to 7C, 8A to 8C, 9A to 9C, 10A to 10C, 11A to 11C, and 12A to 12C may be performed. As a result, the array of the pillar-shaped structures 50 that each include the selection element without the resistive memory element including the lower electrode layer 510 and the resistive memory material layer 520 may be formed.

In yet another embodiment, in a process described with reference to FIGS. 6A, 6B, and 6C, a stacked structure of various other kinds of the conductive layer and the insulation layer may be formed on the lower conductive lines 505 and the lower insulation layer 507. After that, the middle electrode layer 530 and the insulation material layer 540 may be stacked over the insulation layer. Subsequently, the processes described with reference to FIGS. 7A to 7C, 8A to 8C, 9A to 9C, 10A to 10C, 11A to 11C, and 12A to 12C may be performed. As a result, the array of the pillar-shaped structures 50 including various active or passive elements and switching elements coupled to the active or passive elements may be formed.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A method of manufacturing a switching element, the method comprising:
   sequentially forming a first electrode layer and an insulation material layer over a substrate;
   forming a doping mask pattern over the insulation material layer, the doping mask pattern exposing a portion of the insulation material layer;
   injecting dopants into the exposed portion of the insulation material layer;
   removing the doping mask pattern;
   forming a second electrode layer over the insulation material layer; and
   forming one or more pillar-shaped structures, each of which includes a second electrode, an insulation layer, and a first electrode, by respectively patterning the second electrode layer, the insulation material layer, and the first electrode layer,
   wherein each of the one or more pillar-shaped structures includes, in the insulation layer, a part of the exposed portion of the insulation material layer that is doped with the dopants, and
   wherein a threshold switching operation is performed in a region of the insulation layer that is doped with the dopants.

2. The method of claim 1, wherein the region doped with the dopants covers a portion of the insulation layer, the insulation layer being cut off along a direction that is nonparallel to a height direction of the pillar-shaped structure.

3. The method of claim 1, wherein the insulation material layer comprises at least one selected from the group consisting of a silicon oxide material, a silicon nitride material, metal oxide material, and a metal nitride material.

4. The method of claim 3, wherein the metal oxide material comprises at least one selected from the group consisting of an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, and an iron oxide material.

5. The method of claim 1, wherein injecting the dopants into the exposed portion of the insulation material layer comprises doping the exposed portion of the insulation material layer with N-type dopants or P-type dopants.

6. The method of claim 5, wherein the dopant comprises at least one selected from the group consisting of aluminum (Al), lanthanum (La), niobium (Nb), vanadium (V), tantalum (Ta), tungsten (W), chrome (Cr) and molybdenum (Mo), titanium (Ti), copper (Cu), zirconium (Zr), and hafnium (Hf).

7. The method of claim 1, wherein injecting the dopants into the exposed portion of the insulation material layer comprises forming a dopant distribution region using an ion implantation process.

8. The method of claim 7, wherein the dopant distribution region extends from a top surface of the insulation material layer to an interface of the insulation material layer and the first electrode layer.

9. The method of claim 7, wherein at least one boundary of the dopant distribution region is located in a bulk region of the insulation material layer.

10. A switching element array comprising:
    an array of pillar-shaped structures, each of the array of pillar-shaped structures including a first electrode, an insulation layer, and a second electrode; and a threshold switching operation region corresponding to a partial portion of the insulation layer of each of the array of pillar-shaped structures, each of the threshold switching operation regions extending from a partial portion of an outer peripheral surface of the respective pillar-shaped structures to an inside region of the respective pillar-shaped structures, wherein each of the threshold switching operation regions comprises dopants that dope the partial portion of the insulation layer into an N-type region or a P-type region, and wherein the partial portion of the outer peripheral surface of each of the threshold switching operation regions faces the partial portion of the outer peripheral surface of another threshold switching operation region of an adjacent pillar-shaped structure.

11. The switching element array of claim 10, wherein the threshold switching operation region covers a portion of the insulation layer, the insulation layer being cut off along a direction that is nonparallel to a height direction of the pillar-shaped structure.

12. The switching element array of claim 10, wherein the insulation layer comprises at least one selected from the group consisting of a silicon oxide material, a silicon nitride material, a metal oxide material, and a metal nitride material.

13. The switching element array of claim 12, wherein the metal oxide material comprises at least one selected from the group consisting of an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, and an iron oxide material.

14. The switching element array of claim 10, wherein the dopant comprises at least one selected from the group consisting of aluminum (Al), lanthanum (La), niobium (Nb), vanadium (V), tantalum (Ta), tungsten (W), chrome (Cr) and molybdenum (Mo), titanium (Ti), copper (Cu), zirconium (Zr), and hafnium (Hf).

15. The switching element array of claim 10, wherein a portion of the insulation layer of each of the pillar-shaped structures is undoped.

16. The switching element array of claim 10, wherein each of the threshold switching operation regions is spaced apart from a portion of the outer peripheral surface of the respective pillar-shaped structures.

17. A switching element array comprising:
an array of pillar-shaped structures, each of the array of pillar-shaped structures including a first electrode, an insulation layer, and a second electrode; and
a threshold switching operation region disposed in the insulation layer of each of the array of pillar-shaped structures, each of the threshold switching operation regions extending from an outer peripheral surface of the respective pillar-shaped structures to an inside region of the respective pillar-shaped structures,
wherein a portion of the insulation layer of each of the array of pillar-shaped structures is undoped,
wherein each of the threshold switching operation regions comprises dopants that dope the insulation layer into an N-type region or a P-type region, and
wherein each of the threshold switching operation regions faces another threshold switching operation region of an adjacent pillar-shaped structure.

* * * * *